United States Patent
Brauer (10) Patent No.: US 11,113,827 B2
(45) Date of Patent: Sep. 7, 2021

(54) PATTERN-TO-DESIGN ALIGNMENT FOR ONE-DIMENSIONAL UNIQUE STRUCTURES

(71) Applicant: KLA CORPORATION, Milpitas, CA (US)

(72) Inventor: Bjorn Brauer, Beaverton, OR (US)

(73) Assignee: KLA Corporation, Milpitas, CA (US)

( * ) Notice: Subject to any disclaimer, the term of this patent is extended or adjusted under 35 U.S.C. 154(b) by 165 days.

(21) Appl. No.: 16/578,917

(22) Filed: Sep. 23, 2019

(65) Prior Publication Data

US 2021/0090271 A1    Mar. 25, 2021

(51) Int. Cl.
*G06T 7/30* (2017.01)
*G06T 7/00* (2017.01)
*H01L 23/544* (2006.01)

(52) U.S. Cl.
CPC ............... *G06T 7/30* (2017.01); *G06T 7/001* (2013.01); *H01L 23/544* (2013.01); *G06T 2207/20081* (2013.01); *G06T 2207/30148* (2013.01); *H01L 2223/54433* (2013.01)

(58) Field of Classification Search
CPC ......... H01L 2223/54433; H01L 23/544; G06T 2207/20081; G06T 2207/30148; G06T 7/001; G06T 7/30
See application file for complete search history.

(56) References Cited

U.S. PATENT DOCUMENTS

| 7,800,059 | B2 | 9/2010 | Sato et al. |
| 7,813,559 | B2 | 10/2010 | Duquette et al. |
| 9,454,072 | B2 | 9/2016 | Levinski et al. |
| 9,748,128 | B1* | 8/2017 | Chao ................... G03F 7/70775 |
| 9,830,421 | B2 | 11/2017 | Bhattacharyya et al. |
| 10,572,991 | B2* | 2/2020 | Chen ........................ G06T 7/30 |
| 2006/0239535 | A1* | 10/2006 | Takada ...................... G06K 9/00 382/145 |
| 2008/0304734 | A1 | 12/2008 | Young et al. |
| 2016/0061749 | A1* | 3/2016 | Chen ................... G01N 21/9501 356/237.5 |
| 2018/0157933 | A1* | 6/2018 | Brauer ................... G06T 7/0008 |

FOREIGN PATENT DOCUMENTS

KR       20140056336 A       5/2014

OTHER PUBLICATIONS

WIPO, ISR for PCT/US2020/051349, Dec. 23, 2020.

\* cited by examiner

*Primary Examiner* — Bobbak Safaipour
(74) *Attorney, Agent, or Firm* — Hodgson Russ LLP (57) ABSTRACT

Care areas for a first image of a die can be determined according to a 1D offset correction. The 1D offset correction can be based on 1D offsets between the first image and a second image for each of the image frames and also can be based on 1D offsets between a design and the second image for each of the image frames. The care areas can have a zero border for a dimension that is aligned to the design and a legacy border for the other dimension.

19 Claims, 4 Drawing Sheets

PATTERN-TO-DESIGN ALIGNMENT FOR ONE-DIMENSIONAL UNIQUE STRUCTURES

FIELD OF THE DISCLOSURE

This disclosure relates to semiconductor inspection.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Devices on a wafer can be inspected in the X-direction and Y-direction, which are orthogonal. Previously, pattern-to-design (PDA) alignment was performed. A patch image, such as a patch image that was 128 by 128 pixels, was aligned to a design in the X-direction and Y-direction. The defect location is identified based on the image, but only if there are unique structures in the X-direction and Y-direction. If no such sites are found, patch images and design data will not be properly aligned. Consequently, improved coordinate accuracy of the design data cannot be used. This is problematic for memory devices, which typically have unique structures in only one of the X-direction or Y-direction. Thus, design file information cannot be used to improve the care area placement and defect location accuracy.

Without unique targets, inspection is generally performed in both the X-direction and Y-direction. This still can lead to PDA failure if unique two-dimensional (2D) targets are not found. The method typically dismisses one-dimensional (1D) unique targets.

To overcome this problem, legacy care areas that include a buffer around a structure were tried. However, sensitivity is lost and nuisance events in the legacy care area can render this technique unfeasible. Semiconductor manufacturers may not be able to perform accurate inspection and typically seek to minimize the size of any legacy care areas.

Therefore, improved techniques to inspect semiconductor devices are needed.

BRIEF SUMMARY OF THE DISCLOSURE

A system is provided in a first embodiment. The system includes an energy source that generates an energy beam, a stage configured to secure a wafer in a path of the energy beam, a detector that receives the energy beam reflected from the wafer on the stage, and a processor in electronic communication with the detector. The processor is configured to determine one or more care areas for a first image of a die on the wafer according to a 1D offset correction. The 1D offset correction is based on a 1D offset between the first image and a second image for each of image frames. The 1D offset correction is also based on a 1D offset between a design and the second image for each of the image frames.

The energy source can be a light source. The energy beam can be a photon beam.

The second image can be a runtime image.

The one or more care areas each may have a zero border for a dimension that is aligned to the design. The one or more care areas each may have a legacy border for other dimensions.

The processor can be further configured to: find 1D unique targets in the first image of the die; determine a design-to-image 1D offset for each image frame based on the 1D unique targets; perform 1D alignment of the first image to a second image at each of the 1D unique targets; determine a 1D offset between the first image and the second image for each image frame; and determine a 1D offset between a design and the second image for each image frame.

The processor can be further configured to: receive the design for each of the 1D unique targets; generate a rendered image from the design; and perform 1D alignment of the rendered image and the first image at each of the 1D unique targets.

The processor can be further configured to learn image rendering parameters from example targets and apply the image rendering parameters during the generating.

The 1D unique targets can be evenly distributed across the die in the first image.

The processor can be further configured to send instructions to scan an entirety of the die with the energy beam and generate the first image based on the scan of the entirety of the die using information from the detector.

A method is provided in a second embodiment. The method includes determining, using a processor, one or more care areas for a first image of a die according to a 1D offset correction. The 1D offset correction is based on a 1D offset between the first image and a second image for each of image frames. The 1D offset correction is also based on a 1D offset between a design and the second image for each of the image frames.

The second image can be a runtime image.

The one or more care areas each may have a zero border for a dimension that is aligned to the design. The one or more care areas each may have a legacy border for other dimensions.

The method may further include: finding, using the processor, 1D unique targets in the first image of the die; determining, using the processor, a design-to-image 1D offset for each image frame based on the 1D unique targets; performing, using the processor, 1D alignment of the first image to a second image at each of the 1D unique targets; determining, using the processor, a 1D offset between the first image and the second image for each image frame; and determining, using the processor, a 1D offset between a design and the second image for each image frame.

The method may further include: receiving the design for each of the 1D unique targets at the processor; generating, using the processor, a rendered image from the design; and performing, using the processor, 1D alignment of the rendered image and the first image at each of the 1D unique targets.

The method may further include learning image rendering parameters from example targets and applying the image rendering parameters during the generating.

The 1D unique targets can be evenly distributed across the die in the first image.

The method can further include scanning an entirety of a die with an energy beam to generate the first image. The energy beam can be a photon beam.

A non-transitory computer readable medium storing a program can be configured to instruct a processor to execute the method of the second embodiment.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein can render design to patch images if there are no unique patterns in one of the two directions and can use improved care area alignment accuracy in one dimension (1D). This can enable inspection of line space patterns that have no unique features in one direction and can increase sensitivity to certain defects of interest. Increased sensitivity using techniques disclosed herein can improve a semiconductor manufacturer's ability to make processing decisions. For example, memory devices can be inspected with narrow care areas to reduce the number of nuisance events. Whereas previously a semiconductor device without unique patterns in two dimensions was inspected with a large care area covering all structures (e.g., narrow lines, thick lines, and spaces between), design-based alignment can enable inspection of these structures independently using techniques disclosed herein.

Figure 1:
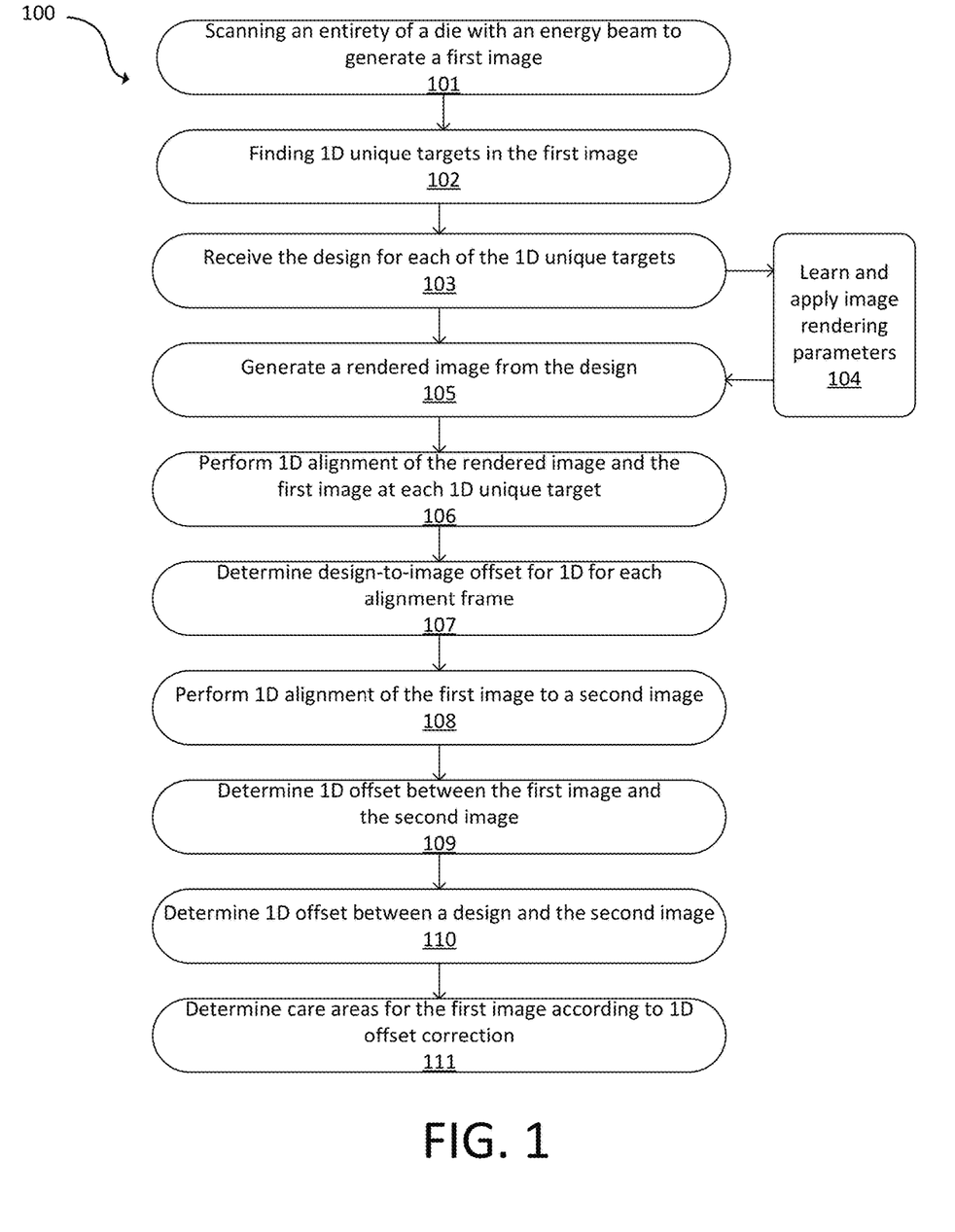
FIG. 1 is a flowchart of a method embodiment in accordance with the present disclosure.

FIG. 1 is a flowchart of a method 100. Some or all of the steps of the method 100 can be performed. For example, only step 111 may be performed or certain steps may be performed on a system separate from the other steps. Some or all of the steps of method 100 may be performed using a processor. At 101, an entirety of a die on a semiconductor wafer is scanned with an energy beam, such as a photon or electron beam. A first image is generated based on the scanning.

The processor finds 1D unique targets in the first image at 102. By "unique," there are no other structures within an image that resemble the target. Usually those images (i.e., image frames) are of size 128 by 128 pixels. For the 1D case the pattern is unique when going through the image in one direction. The 1D unique targets may be evenly distributed across the die in the first image, but can have other distributions. Thus, there is at least one alignment target within an area of 128 by 128 pixels. Alignment accuracy may become compromised the further away the 1D unique target is from the 128 by 128 pixels area.

The image frame can be an inspection frame or an alignment frame. An inspection frame is typically 1000 by 1000 pixels, though other sizes are possible. The inspection frame is used to calculate a noise floor of the frame and a signal of the defect. The defect is in an inspection frame. Such inspection frames can be superimposed to an alignment frame map, which may include multiple smaller alignment frames. Assuming the alignment frame that superimposes with the defect has a good alignment target (e.g., device feature) in it, the offset between the wafer image and the design can be determined. Without a good alignment target in the alignment frame that superimposes with the defect, an adjacent alignment frame can be used to provide an alignment target. Using an alignment target proximate the defect may be more accurate.

The processor can receive a design for the 1D unique targets at 103. A rendered image can be generated from the design at 105. Optionally, the processor can learn image rendering parameters from example targets and apply the image rendering parameters while generating the rendered image at 104.

At 106, 1D alignment of the rendered image and the first image is performed at each of the 1D unique targets. Alignment can be performed by calculating a normalized sum square difference (NSSD) of the two images. If there are two images that are not aligned to each other and have 1D unique structures (e.g., horizontal lines with different spacing), the two images can be aligned along the Y-direction due to the spacing. Thus, the target image (i.e., runtime image) can be moved one pixel at the time with respect to the reference image (i.e., setup image) in the Y-direction. Each time the sum of squared differences for all pixels within the two images is calculated and the NSSD value is stored for each pixel shift. When fitting the NSSD curve (e.g., by using a parabolic fit), where the minimum of this curve lies can be determined. Thus, the offset between the two images can be determined with sub-pixel accuracy.

The setup and runtime image may only be moved in one direction (e.g., the one which is useful for alignment) when calculating the NSSD. The offset may only be determined in one direction.

NSSD involves normalization, which means each image can be pre-processed. This can be done by subtracting the mean grey level and dividing by the standard deviation of grey levels for each image. This can help when, for example, the image on a setup wafer is darker than on a runtime wafer or the contrast changes between a setup wafer and a runtime wafer.

A design-to-image 1D offset for each image frame is determined at 107 based on the 1D unique targets. The design-to-image 1D offset is the offset between the image from the runtime wafer and the design. The offset between setup and runtime images can be determined using the NSSD curve. The offset between the setup image and design may be known. Consequently, the offset between the runtime image and the design can be calculated.

At 108, 1D alignment of the first image to a second image at each of the 1D unique targets is performed. The second image can be, for example, a runtime image. Whereas the first image is collected on the setup wafer, the second image can be collected during runtime. This means that the second image is collected on the same wafer or any other wafer during runtime (i.e., when defect inspection takes place).

At 109, a 1D offset between the first image and the second image are determined for each image frame. The frame which is used for alignment is typically 128 by 128 pixels. Care areas (CAs) can vary in size, but tend to be 1 pixel or greater in dimension. The largest care areas can be as large as a die. Most care areas are somewhere between these two extremes. Even if the care areas are larger than the image frame itself, acceptable care area alignment can be achieved because the care areas are at a fixed position in the design coordinate system. If the offset between the runtime image and the design can be determined, any care area can be placed accurately. At 110, a 1D offset between a design and the second image are determined for each image frame.

One or more care areas for the first image of the die are determined at 111. The care areas are determined according to 1D offset correction, which can be based on 1D offsets between the first image and a second image for each of the image frames and can be based on 1D offsets between a design and the second image for each of the image frames. Thus, care areas are determined based on unique structures in the X-direction or Y-direction, but not both.

After the offset between design and runtime image in one dimension is determined, in which CA every pixel within the image falls will be known because the care areas are fixed with respect to design. 1D offsets between the first and second image can assist when placing a care area because the offset between a runtime image and design can be determined and, thus, where to place the care area can be determined. Care areas can be fixed with respect to the design.

The care areas can have zero border for a dimension that is aligned to the design. The care areas can have a legacy border for other dimensions. The design alignment may be within a fraction of a pixel, so the care area border can be set to zero pixels. A legacy border may be approximately 1 but other larger dimensions are possible. In an instance with lines that are 100 μm long, adding 1 μm doesn't introduce too much nuisance. However, in the other dimensions requiring good alignment a 1 μm CA expansion would probably cover all the gaps between the lines and, thus, introduce nuisance.

It is expected that the method 100 will provide improved sensitivity by an order of magnitude. A reduction in nuisance also is expected because the care area is closer to the structure being inspected. Nuisance reduction is dependent on the device structure, but a 750% reduction in nuisance may be possible for some memory devices.

Figure 2:
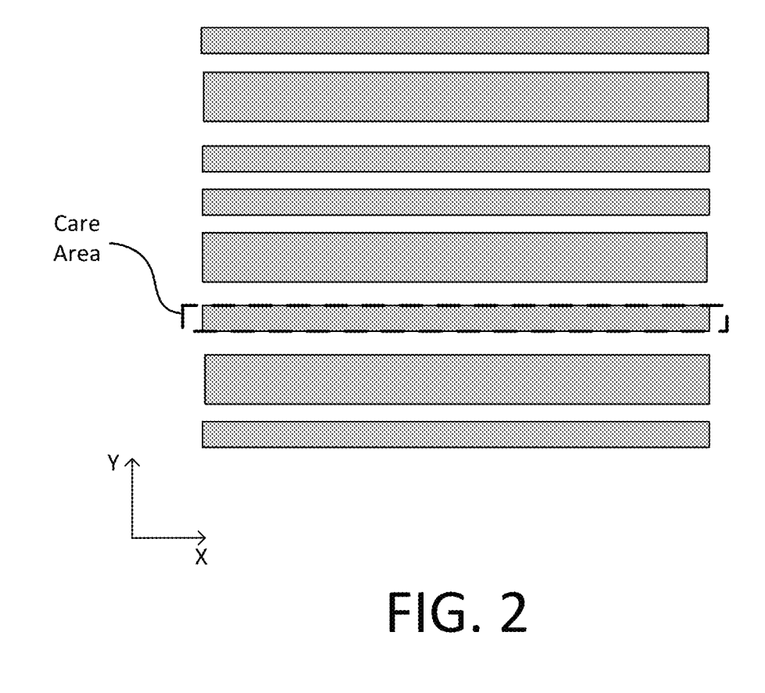
FIG. 2 illustrates exemplary 1D alignment in the Y direction.

The method 100 considers targets that are unique in one direction. For example, if there are horizontal lines, the design can be rendered so that the rendered design matches the patch images on the wafer. This is shown in FIG. 2, which shows an exemplary optical image of a pattern on a wafer. The pattern, which can be a device structure, is shown by shaded rectangles. During setup, the Y offset between the patch images and the rendered design images can be stored. During runtime, the Y offset between the setup patch images and the runtime images also can be stored. From both the offsets, the exact Y location of the care areas (one shown using dashed lines) can be determined. This can enable use of a zero border around the pattern in the Y direction and a legacy border around the pattern in the X direction. The zero border can hug the pattern on the wafer. The legacy care area may be slightly larger than the pattern on the wafer. Legacy-based and design-based placement can be combined. As seen in FIG. 2, a zero care area border is used in the Y direction and a legacy care area border is placed in the X direction. The care area can be accurately placed in the Y direction, which enables the zero care area border in the Y direction.

Depending on the application, the care area border also can shrink the size of the care area instead of extending it.

Figure 3:
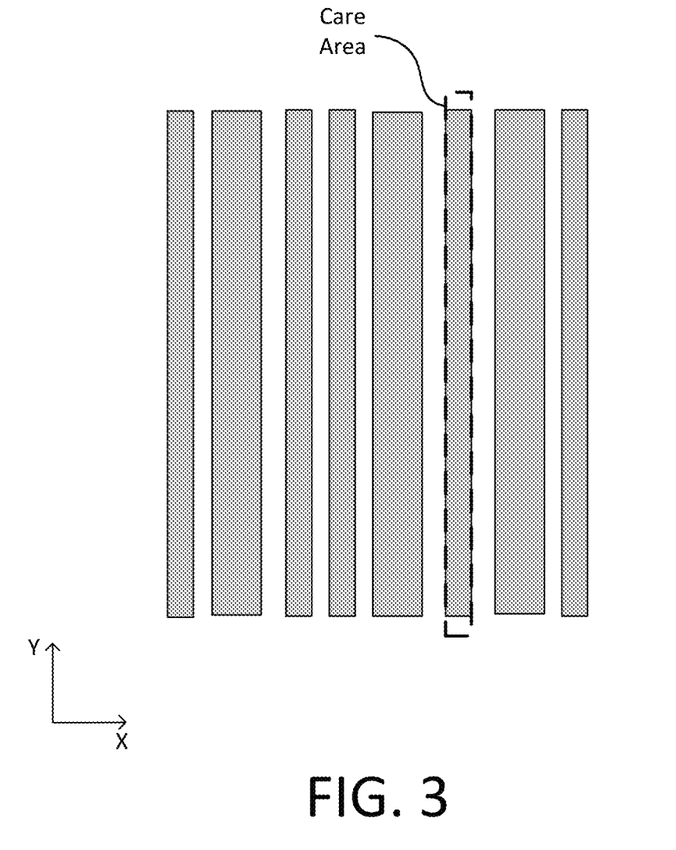
FIG. 3 illustrates exemplary 1D alignment in the X direction.

FIG. 3 illustrates exemplary 1D alignment in the X direction. The operation shown in FIG. 3 is similar to that described with FIG. 2. FIG. 3 shows an exemplary optical image of a pattern on a wafer. A zero care area border around the pattern is used in the X direction and a legacy care area border around the pattern is placed in the Y direction. The care area can be accurately placed in the X direction, which enables the zero care area border in the X direction.

Figure 4:
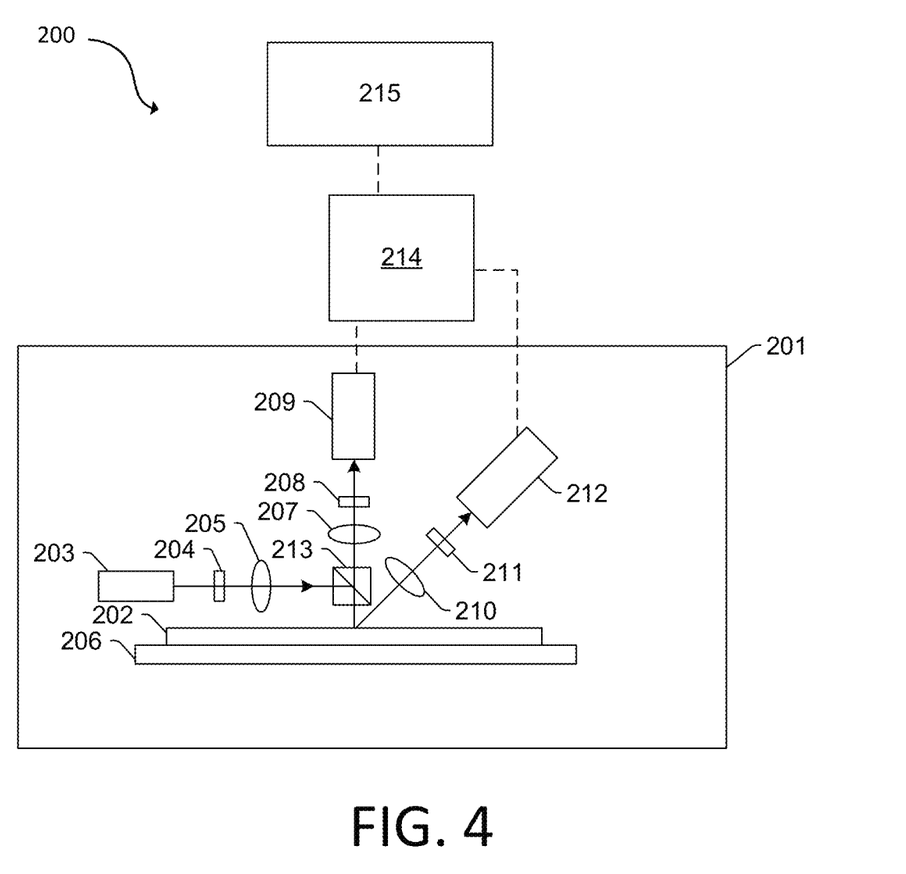
FIG. 4 illustrates an embodiment of a system in accordance with the present disclosure.

One embodiment of a system 200 is shown in FIG. 4. The system 200 includes optical based subsystem 201. In general, the optical based subsystem 201 is configured for generating optical based output for a specimen 202 by directing light to (or scanning light over) and detecting light from the specimen 202. In one embodiment, the specimen 202 includes a wafer. The wafer may include any wafer known in the art. In another embodiment, the specimen includes a reticle. The reticle may include any reticle known in the art.

In the embodiment of the system 200 shown in FIG. 4, optical based subsystem 201 includes an illumination subsystem configured to direct light (e.g., photons) to specimen 202. The illumination subsystem includes at least one light source. For example, as shown in FIG. 4, the illumination subsystem includes an energy source that generates and energy beam, such as the light source 203 that generates a photon beam. In one embodiment, the illumination subsystem is configured to direct the light to the specimen 202 at one or more angles of incidence, which may include one or more oblique angles and/or one or more normal angles. For example, as shown in FIG. 4, light from light source 203 is directed through optical element 204 and then lens 205 to specimen 202 at an oblique angle of incidence. The oblique angle of incidence may include any suitable oblique angle of incidence, which may vary depending on, for instance, characteristics of the specimen 202.

The optical based subsystem 201 may be configured to direct the light to the specimen 202 at different angles of incidence at different times. For example, the optical based subsystem 201 may be configured to alter one or more characteristics of one or more elements of the illumination subsystem such that the light can be directed to the specimen 202 at an angle of incidence that is different than that shown in FIG. 4. In one such example, the optical based subsystem 201 may be configured to move light source 203, optical element 204, and lens 205 such that the light is directed to the specimen 202 at a different oblique angle of incidence or a normal (or near normal) angle of incidence.

In some instances, the optical based subsystem 201 may be configured to direct light to the specimen 202 at more than one angle of incidence at the same time. For example, the illumination subsystem may include more than one illumination channel, one of the illumination channels may include light source 203, optical element 204, and lens 205 as shown in FIG. 4 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 202 at different angles of incidence may be different such that light resulting from illumination of the specimen 202 at the different angles of incidence can be discriminated from each other at the detector(s).

In another instance, the illumination subsystem may include only one light source (e.g., light source 203 shown in FIG. 4) and light from the light source may be separated into different optical paths (e.g., based on wavelength, polarization, etc.) by one or more optical elements (not shown) of the illumination subsystem. Light in each of the different optical paths may then be directed to the specimen 202. Multiple illumination channels may be configured to direct light to the specimen 202 at the same time or at different times (e.g., when different illumination channels are used to sequentially illuminate the specimen). In another instance, the same illumination channel may be configured to direct light to the specimen 202 with different characteristics at different times. For example, in some instances, optical element 204 may be configured as a spectral filter and the properties of the spectral filter can be changed in a variety of different ways (e.g., by swapping out the spectral filter) such that different wavelengths of light can be directed to the specimen 202 at different times. The illumination subsystem may have any other suitable configuration known in the art for directing the light having different or the same characteristics to the specimen 202 at different or the same angles of incidence sequentially or simultaneously.

In one embodiment, light source 203 may include a broadband plasma (BBP) source. In this manner, the light generated by the light source 203 and directed to the specimen 202 may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 203 may also include a polychromatic light source that generates light at multiple discrete wavelengths or wavebands.

Light from optical element 204 may be focused onto specimen 202 by lens 205. Although lens 205 is shown in FIG. 4 as a single refractive optical element, it is to be understood that, in practice, lens 205 may include a number of refractive and/or reflective optical elements that in combination focus the light from the optical element to the specimen. The illumination subsystem shown in FIG. 4 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 213), aperture(s), and the like, which may include any such suitable optical elements known in the art. In addition, the optical based subsystem 201 may be configured to alter one or more of the elements of the illumination subsystem based on the type of illumination to be used for generating the optical based output.

The optical based subsystem 201 may also include a scanning subsystem configured to cause the light to be scanned over the specimen 202. For example, the optical based subsystem 201 may include stage 206 on which specimen 202 is disposed during optical based output generation. Thus, the stage 206 can secure the specimen 202. The scanning subsystem may include any suitable mechanical and/or robotic assembly (that includes stage 206) that can be configured to move the specimen 202 such that the light can be scanned over the specimen 202. In addition, or alternatively, the optical based subsystem 201 may be configured such that one or more optical elements of the optical based subsystem 201 perform some scanning of the light over the specimen 202. The light may be scanned over the specimen 202 in any suitable fashion such as in a serpentine-like path or in a spiral path.

The optical based subsystem 201 further includes one or more detection channels. At least one of the one or more detection channels includes a detector configured to detect light from the specimen 202 due to illumination of the specimen 202 by the subsystem and to generate output responsive to the detected light. For example, the optical based subsystem 201 shown in FIG. 4 includes two detection channels, one formed by collector 207, element 208, and detector 209 and another formed by collector 210, element 211, and detector 212. As shown in FIG. 4, the two detection channels are configured to collect and detect light at different angles of collection. In some instances, both detection channels are configured to detect scattered light, and the detection channels are configured to detect tight that is scattered at different angles from the specimen 202. However, one or more of the detection channels may be configured to detect another type of light from the specimen 202 (e.g., reflected light).

As further shown in FIG. 4, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 210, element 211, and detector 212 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 4 shows an embodiment of the optical based subsystem 201 that includes two detection channels, the optical based subsystem 201 may include a different number of detection channels (e.g., only one detection channel or two or more detection channels). In one such instance, the detection channel formed by collector 210, element 211, and detector 212 may form one side channel as described above, and the optical based subsystem 201 may include an additional detection channel (not shown) formed as another side channel that is positioned on the opposite side of the plane of incidence. Therefore, the optical based subsystem 201 may include the detection channel that includes collector 207, element 208, and detector 209 and that is centered in the plane of incidence and configured to collect and detect light at scattering angle(s) that are at or close to normal to the specimen 202 surface. This detection channel may therefore be commonly referred to as a "top" channel, and the optical based subsystem 201 may also include two or more side channels configured as described above. As such, the optical based subsystem 201 may include at least three channels (i.e., one top channel and two side channels), and each of the at least three channels has its own collector, each of which is configured to collect light at different scattering angles than each of the other collectors.

As described further above, each of the detection channels included in the optical based subsystem 201 may be configured to detect scattered light. Therefore, the optical based subsystem 201 shown in FIG. 4 may be configured for dark field (DF) output generation for specimens 202. However, the optical based subsystem 201 may also or alternatively include detection channel(s) that are configured for bright field (BF) output generation for specimens 202. In other words, the optical based subsystem 201 may include at least one detection channel that is configured to detect light specularly reflected from the specimen 202. Therefore, the optical based subsystems 201 described herein may be configured for only DF, only BF, or both DF and BF imaging. Although each of the collectors are shown in FIG. 4 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 214 may be configured to generate images of the specimen 202 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 4 is provided herein to generally illustrate a configuration of an optical based subsystem 201 that may be included in the system embodiments described herein or that may generate optical based output that is used by the system embodiments described herein. The optical based subsystem 201 configuration described herein may be altered to optimize the performance of the optical based subsystem 201 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 214 may be coupled to the components of the system 200 in any suitable manner (e.g., via one or more transmission media, which may include wired and/or wireless transmission media) such that the processor 214 can receive output. The processor 214 may be configured to perform a number of functions using the output. The system 200 can receive instructions or other information from the processor 214. The processor 214 and/or the electronic data storage unit 215 optionally may be in electronic communication with a wafer inspection tool, a wafer metrology tool, or a wafer review tool (not illustrated) to receive additional information or send instructions. For example, the processor 214 and/or the electronic data storage unit 215 can be in electronic communication with an SEM.

The processor 214, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 214 and electronic data storage unit 215 may be disposed in or otherwise part of the system 200 or another device. In an example, the processor 214 and electronic data storage unit 215 may be part of a standalone control unit or in a centralized quality control unit. Multiple processors 214 or electronic data storage units 215 may be used.

The processor 214 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 214 to implement various methods and functions may be stored in readable storage media, such as a memory in the electronic data storage unit 215 or other memory.

If the system 200 includes more than one processor 214, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 214 may be configured to perform a number of functions using the output of the system 200 or other output. For instance, the processor 214 may be configured to send the output to an electronic data storage unit 215 or another storage medium. The processor 214 may be further configured as described herein.

The processor 214 may be configured according to any of the embodiments described herein. The processor 214 also may be configured to perform other functions or additional steps using the output of the system 200 or using images or data from other sources.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 214 or, alternatively, multiple processors 214. Moreover, different subsystems of the system 200 may include one or more computing or logic systems. Therefore, the above description should not be interpreted as a limitation on the present disclosure but merely an illustration.

In an instance, the processor 214 is in communication with the system 200. The processor 214 is configured to determine care areas for a first image of a die on the wafer according to a 1D offset correction. The 1D offset correction is based on 1D offsets between the first image and a second image (e.g., a runtime image) for each of image frames and is the 1D offset correction is based on 1D offsets between a design and the second image for each of the image frames. The care areas can have a zero border for a dimension that is aligned to the design and a legacy border for other dimensions.

The processor 214 can be further configured to: find 1D unique targets in the first image of the die; determine a design-to-image 1D offset for each image frame based on the 1D unique targets; perform 1D alignment of the first image to a second image at each of the 1D unique targets; determine a 1D offset between the first image and the second image for each image frame; and determine a 1D offset between a design and the second image for each image frame. The 1D unique targets can be evenly distributed across the die in the first image.

The processor 214 can be further configured to: receive the design for each of the 1D unique targets; generate a rendered image from the design; and perform 1D alignment of the rendered image and the first image at each of the 1D unique targets.

The processor 214 can be further configured to learn image rendering parameters from example targets and apply the image rendering parameters during the generating.

The processor 214 also can be configured to send instructions to scan an entirety of the die with the energy beam and generate the first image based on the scan of the entirety of the die using information from the detector.

An additional embodiment relates to a non-transitory computer-readable medium storing program instructions executable on a controller for performing a computer-implemented method for wafer inspection, as disclosed herein. In particular, as shown in FIG. 4, electronic data storage unit 215 or other storage medium may contain non-transitory computer-readable medium that includes program instructions executable on the processor 214. The computer-implemented method may include any step(s) of any method(s) described herein, including method 100.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

While disclosed with respect to a photon beam, embodiments of the method disclosed herein can be performed with an electron beam. Thus, the system may be an electron beam system with an electron beam source, a stage, and a detector.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
   an energy source that generates an energy beam;
   a stage configured to secure a wafer in a path of the energy beam;
   a detector that receives the energy beam reflected from the wafer on the stage; and
   a processor in electronic communication with the detector; wherein the processor is configured to:
   determine one or more care areas for a first image of a die on the wafer according to a 1D offset correction, wherein the 1D offset correction is based on a 1D offset between the first image and a second image for each of image frames and the 1D offset correction is further based on a 1D offset between a design and the second image for each of the image frames.

2. The system of claim 1, wherein the energy source is a light source and the energy beam is a photon beam.

3. The system of claim 1, wherein the second image is a runtime image.

4. The system of claim 1, wherein the one or more care areas each have a zero border for a dimension that is aligned to the design, and wherein the one or more care areas each have a legacy border for other dimensions.

5. The system of claim 1, wherein the processor is further configured to:
   find 1D unique targets in the first image of the die;
   determine a design-to-image 1D offset for each image frame based on the 1D unique targets;
   perform 1D alignment of the first image to a second image at each of the 1D unique targets;
   determine a 1D offset between the first image and the second image for each image frame; and
   determine a 1D offset between a design and the second image for each image frame.

6. The system of claim 5, wherein the processor is further configured to:
   receive the design for each of the 1D unique targets;
   generate a rendered image from the design; and
   perform 1D alignment of the rendered image and the first image at each of the 1D unique targets.

7. The system of claim 6, wherein the processor is further configured to learn image rendering parameters from example targets and apply the image rendering parameters during the generating.

8. The system of claim 5, wherein the 1D unique targets are evenly distributed across the die in the first image.

9. The system of claim 1, wherein the processor is further configured to:
   send instructions to scan an entirety of the die with the energy beam; and
   generate the first image based on the scan of the entirety of the die using information from the detector.

10. A method comprising:
    determining, using a processor, one or more care areas for a first image of a die according to a 1D offset correction, wherein the 1D offset correction is based on a 1D offset between the first image and a second image for each of image frames and the 1D offset correction is further based on a 1D offset between a design and the second image for each of the image frames.

11. The method of claim 10, wherein the second image is a runtime image.

12. The method of claim 10, wherein the one or more care areas each have a zero border for a dimension that is aligned to the design, and wherein the one or more care areas each have a legacy border for other dimensions.

13. The method of claim 10, further comprising:
- finding, using the processor, 1D unique targets in the first image of the die;
- determining, using the processor, a design-to-image 1D offset for each image frame based on the 1D unique targets;
- performing, using the processor, 1D alignment of the first image to a second image at each of the 1D unique targets;
- determining, using the processor, a 1D offset between the first image and the second image for each image frame; and
- determining, using the processor, a 1D offset between a design and the second image for each image frame.

14. The method of claim 13, further comprising:
- receiving the design for each of the 1D unique targets at the processor;
- generating, using the processor, a rendered image from the design; and
- performing, using the processor, 1D alignment of the rendered image and the first image at each of the 1D unique targets.

15. The method of claim 14, further comprising learning image rendering parameters from example targets and applying the image rendering parameters during the generating.

16. The method of claim 13, wherein the 1D unique targets are evenly distributed across the die in the first image.

17. The method of claim 13, further comprising scanning an entirety of a die with an energy beam to generate the first image.

18. The method of claim 17, wherein the energy beam is a photon beam.

19. A non-transitory computer readable medium storing a program configured to instruct a processor to execute the method of claim 10.

* * * * *